(12) United States Patent
Zeng et al.

(10) Patent No.: US 10,115,468 B2
(45) Date of Patent: Oct. 30, 2018

(54) SOLID STATE STORAGE DEVICE AND READ CONTROL METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Shih-Jia Zeng, Taipei (TW); Jen-Chien Fu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/479,315

(22) Filed: Apr. 5, 2017

(65) Prior Publication Data

US 2018/0211713 A1 Jul. 26, 2018

(30) Foreign Application Priority Data

Jan. 26, 2017 (CN) .......................... 2017 1 0061595

(51) Int. Cl.
  *G11C 16/26* (2006.01)
  *G06F 12/08* (2016.01)
  *G06F 12/0875* (2016.01)

(52) U.S. Cl.
  CPC .......... *G11C 16/26* (2013.01); *G06F 12/0875* (2013.01); *G06F 2212/60* (2013.01)

(58) Field of Classification Search
  None
  See application file for complete search history.

(56) References Cited

U.S. PATENT DOCUMENTS

| 6,418,521 B1* | 7/2002 | Mathews | G06F 12/1027 711/122 |
| 2013/0070526 A1* | 3/2013 | Eun | G11C 16/26 365/185.03 |
| 2015/0286527 A1* | 10/2015 | Wu | G11C 11/5642 714/773 |
| 2018/0046527 A1* | 2/2018 | Reusswig | G06F 11/076 |

* cited by examiner

*Primary Examiner* — Denise Tran
(74) *Attorney, Agent, or Firm* — McClure, Qualey & Rodack, LLP

(57) ABSTRACT

A solid state storage device includes a non-volatile memory and a controlling circuit. In a first read retry process, the controlling circuit judges whether an information corresponding to a first block of the non-volatile memory is recorded in the cache table. If the information is not recorded in the cache table, the controlling circuit sequentially provides plural predetermined retry read voltage sets to the non-volatile memory according to a sequence of the plural predetermined retry read voltage sets in the retry table and performs a read retry operation. If a read data of the first block is successfully decoded through the read retry operation according to a first predetermined retry read voltage set of the plural predetermined retry read voltage sets in the retry table, the controlling circuit records the first predetermined retry read voltage set into the cache table.

13 Claims, 7 Drawing Sheets

|  | B0 | B1 | ... | B127 |
|---|---|---|---|---|
| Slot 0 | | | | |
| Slot 1 | | | | |
| Slot 2 | | | | |
| ⋮ | | | | |
| Slot s-1 | | | | |

|  | B0 | B1 | ... | B127 |
|---|---|---|---|---|
| Slot 0 | | Vr_r2 | | |
| Slot 1 | | | | |
| Slot 2 | | | | |
| ⋮ | | | | |
| Slot s-1 | | | | |

|  | B0 | B1 | ... | B127 |
|---|---|---|---|---|
| Slot 0 | | Vr_r2 | | |
| Slot 1 | | Vr_r8 | | |
| Slot 2 | | | | |
| ⋮ | | | | |
| Slot s-1 | | | | |

|  | B0 | B1 | ... | B127 |
|---|---|---|---|---|
| Slot 0 | | Vr_r2 | | |
| Slot 1 | | Vr_r8 | | |
| Slot 2 | | Vr_rm | | |
| ⋮ | | | | |
| Slot s-1 | | | | |

|  | B0 | B1 | ... | B127 |
|---|---|---|---|---|
| Slot 0 | | FF | | |
| Slot 1 | | | | |
| Slot 2 | | | | |
| ⋮ | | | | |
| Slot s-1 | | | | |

| 308a → | Entry 0 | Entry 1 | ... | Entry 127 |
|---|---|---|---|---|
| | | | | |

| 308b → | | Entry 0 | Entry 1 | ... | Entry 127 |
|---|---|---|---|---|---|
| | Slot 0 | | | | |
| | Slot 1 | | | | |
| | Slot 2 | | | | |
| | ⋮ | | | | |
| | Slot s-1 | | | | |

| 308a → | Entry 0 | Entry 1 | ... | Entry 127 |
|---|---|---|---|---|
| | | B129 | | |

| 308b → | | Entry 0 | Entry 1 | ... | Entry 127 |
|---|---|---|---|---|---|
| | Slot 0 | | Vr_r6 | | |
| | Slot 1 | | | | |
| | Slot 2 | | | | |
| | ⋮ | | | | |
| | Slot s-1 | | | | |

| 308a → | Entry 0 | Entry 1 | ... | Entry 127 |
|---|---|---|---|---|
| | | B129 | | |

| 308b → | | Entry 0 | Entry 1 | ... | Entry 127 |
|---|---|---|---|---|---|
| | Slot 0 | | Vr_r6 | | |
| | Slot 1 | | Vr_r12 | | |
| | Slot 2 | | | | |
| | ⋮ | | | | |
| | Slot s-1 | | | | |

| 308 | | | | |
|---|---|---|---|---|
| 308a → | Entry 0 | Entry 1 | • • • | Entry 127 |
| | | B129 | | |

| 308b → | | Entry 0 | Entry 1 | • • • | Entry 127 |
|---|---|---|---|---|---|
| | Slot 0 | | Vr_r6 | | |
| | Slot 1 | | Vr_r12 | | |
| | Slot 2 | | Vr_rm | | |
| | ⋮ | | | | |
| | Slot s-1 | | | | |

FIG. 7E

| 308 | | | | |
|---|---|---|---|---|
| 308a → | Entry 0 | Entry 1 | • • • | Entry 127 |
| | | B129 | | |

| 308b → | | Entry 0 | Entry 1 | • • • | Entry 127 |
|---|---|---|---|---|---|
| | Slot 0 | | FF | | |
| | Slot 1 | | | | |
| | Slot 2 | | | | |
| | ⋮ | | | | |
| | Slot s-1 | | | | |

FIG. 7F

| 308 | | | | |
|---|---|---|---|---|
| 308a → | Entry 0 | Entry 1 | • • • | Entry 127 |
| | | B385 | | |

| 308b → | | Entry 0 | Entry 1 | • • • | Entry 127 |
|---|---|---|---|---|---|
| | Slot 0 | | Vr_r3 | | |
| | Slot 1 | | | | |
| | Slot 2 | | | | |
| | ⋮ | | | | |
| | Slot s-1 | | | | |

SOLID STATE STORAGE DEVICE AND READ CONTROL METHOD THEREOF

This application claims the benefit of People's Republic of China Patent Application No. 201710061595.5, filed Jan. 26, 2017, the subject matter of which is incorporated herein by reference.

FIELD OF THE INVENTION

The present invention relates to a storage device and a control method, and more particularly to a solid state storage device and a read control method thereof.

BACKGROUND OF THE INVENTION

As is well known, solid state storage devices such as SD cards or solid state drives (SSD) are widely used in a variety of electronic devices. Generally, a solid state storage device comprises a controlling circuit and a non-volatile memory.

FIG. 1 is a schematic functional block diagram illustrating a conventional solid state storage device. As shown in FIG. 1, the solid state storage device 10 is connected with a host 14 through an external bus 12. Generally, the external bus 12 is a USB bus, an SATA bus, a PCIe bus, or the like. Moreover, the solid state storage device 10 comprises a controlling circuit 101 and a non-volatile memory 105. The controlling circuit 101 is connected with the non-volatile memory 105 through an internal bus 107. According to a command from the host 14, the controlling circuit 101 stores the received write data into the non-volatile memory 105, or the controlling circuit 101 acquires a read data from the non-volatile memory 105 and transmits the read data to the host 14.

Generally, the controlling circuit 101 stores a default read voltage set. During a read cycle, the controlling circuit 101 acquires the read data from the non-volatile memory 105 according to the default read voltage set.

The controlling circuit 101 further comprises an error correction (ECC) circuit 104 and a retry table 106. The ECC circuit 104 is used for correcting the error bits of the read data. After the error bits of the read data are corrected, the corrected read data are transmitted to the host 14. However, if the ECC circuit 104 is unable to successfully correct all bits of the read data, the retry table 106 provides another retry read voltage set to the controlling circuit 101. According to the retry read voltage set, the controlling circuit 101 performs a read retry operation on the non-volatile memory 105.

The non-volatile memory 105 such as a flash memory comprises a memory array (not shown). The memory array comprises plural memory cells. In the memory array, each memory cell comprises a floating gate transistor. Depending on the amount of data to be stored in the memory cell, the flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

Moreover, the floating gate of the floating gate transistor of each memory cell can store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the non-volatile memory 105, the amount of hot carriers to be injected into the floating gate is controlled by the controlling circuit 101. Consequently, the threshold voltage of the floating gate transistor is correspondingly changed. During a read cycle, the controlling circuit 101 provides a read voltage set to the floating gate of the floating gate transistor and determines the storing state of the floating gate transistor by judging whether the floating gate transistor is turned on.

FIG. 2A schematically illustrates the threshold voltage distribution curves of the MLC flash memory in different storing states. Each cell of the MLC flash memory has four storing states (00), (01), (10) and (11) according to the amount of the injected hot carriers. Before the hot carriers are injected into the cell, the cell is in the first storing state (00).

In practical, even if many cells are in the same storing state during the program cycle, the threshold voltages of these cells are not all identical. That is, the threshold voltages of these cells are distributed in a specified distribution curve with a median threshold voltage. As shown in FIG. 2A, the cells in the first storing state (00) have a median threshold voltage $V_{THE}$ (e.g. 0V), the cells in the second storing state (01) have a median threshold voltage $V_{THA}$ (e.g. 10V), the cells in the storing state (10) have a median threshold voltage $V_{THB}$ (e.g. 20V), and the cells in the storing state (11) have a median threshold voltage $V_{THC}$ (e.g. 30V).

Please refer to FIG. 2A again. According to the above characteristics of the MLC flash memory, a read voltage set including three read voltages Vra, Vrb and Vrc is defined. During the read cycle, the controlling circuit 101 provides the three read voltages of the read voltage set to the MLC flash memory in order to detect the storing states of the cells of the MLC flash memory.

For example, the controlling circuit 101 provides the read voltage Vrb to the non-volatile memory 105. If the threshold voltage of the cell is lower than the read voltage Vrb and the cell can be turned on, the controlling circuit 101 judges that the cell is in the first storing state (00) or the second storing state (01). Then, the controlling circuit 101 provides the read voltage Vra to the non-volatile memory 105. If the cell can be turned on, the controlling circuit 101 judges that the cell is in the first storing state (00). Whereas, if the cell cannot be turned on, the controlling circuit 101 judges that the cell is in the second storing state (01).

On the other hand, if the threshold voltage of the cell is higher than the read voltage Vrb and the cell cannot be turned on, the controlling circuit 101 judges that the cell is in the third storing state (10) or the fourth storing state (11). Then, the controlling circuit 101 provides the read voltage Vrc to the non-volatile memory 105. If the cell can be turned on, the controlling circuit 101 judges that the cell is in the third storing state (10). Whereas, if the cell cannot be turned on, the controlling circuit 101 judges that the cell is in the fourth storing state (11).

Similarly, the controlling circuit 101 can employ one read voltage to determine the storing states of one bit of the SLC flash memory. Similarly, the controlling circuit 101 can use a read voltage set including seven read voltages to determine the storing states of three bits of the TLC flash memory.

As mentioned above, the read voltage set is important for determining the storing states of the cells. However, after the non-volatile memory 105 has been used for a certain time period, the characteristics of the cells are subjected to changes. Under this circumstance, the threshold voltage distribution curves of the storing state of all cells in the non-volatile memory 105 are possibly changed, and the median threshold voltages are shifted. If the original read voltage set is still used to read the data of the non-volatile memory 105, the number of error bits increases. Since the number of the erroneously-judged cells is large, the ECC circuit 104 cannot effectively correct all of the error bits.

For solving the above drawbacks, the controlling circuit 101 uses the retry table 106 to record plural read voltage sets. If the controlling circuit 101 confirms that the ECC circuit 104 cannot effectively correct all of the error bits, the controlling circuit 101 performs a read retry operation. That is, the controlling circuit 101 acquires another read voltage set from the retry table 106. Moreover, the read voltage set is provided to the non-volatile memory 105 in order to read the data again.

FIG. 2B is a flowchart illustrating a read control method for a solid state storage device according to the prior art. During the read cycle, the controlling circuit 101 firstly performs a decoding process A. In the decoding process A, a hard decoding operation is performed according to a default read voltage set Vr_d.

That is, the controlling circuit 101 provides the default read voltage set Vr_d to the non-volatile memory 105 to acquire the read data, and the ECC circuit 104 performs the hard decoding operation to correct the read data. If the error bits in the read data can be corrected, it means that the decoding operation is successfully done and the decoding process A passes. Whereas, if the error bits in the read data cannot be corrected, the decoding process A fails. Then, the controlling circuit 101 performs a read retry process.

In the read retry process, a decoding process B is firstly performed. In the decoding process B, a hard decoding operation is performed according to the retry read voltage set.

For example, m retry read voltage sets have been previously stored in the retry table 106. In the decoding process B, the controlling circuit 101 acquires a first retry read voltage set Vr_r1 from the retry table 106 to the non-volatile memory 105, and the ECC circuit 104 performs the hard decoding operation to correct the read data. If the error bits in the read data can be corrected, it means that the decoding operation is successfully done and the decoding process B passes. Whereas, if the error bits in the read data cannot be corrected by using the first retry read voltage set Vr_r1, the controlling circuit 101 acquires a second retry read voltage set Vr_r2 from the retry table 106 and judges whether the decoding operation is successfully done.

As mentioned above, m retry read voltage sets Vr_r1~Vr_rm are stored in the retry table 106. In the decoding process B, the controlling circuit 101 sequentially performs the hard decoding operation according to the predetermined sequence of the m retry read voltage sets Vr_r1~Vr_rm in the retry table 106. If the decoding operation is successfully done according to one of the m retry read voltage sets Vr_r1~Vr_rm, it means that the decoding process B passes. Whereas, if the data cannot be successfully decoded according to the entire of the m retry read voltage sets Vr_r1~Vr_rm, it means that the decoding process B fails. Then, the controlling circuit 101 performs a decoding process C. Obviously, the time period of performing the decoding process B is longer than the time period of performing the decoding process A.

In the decoding process C, a soft decoding operation is performed according to the retry read voltage set. Generally, the soft decoding operation has better error correction capability than the hard decoding operation. However, in comparison with the read voltage set for the hard decoding operation, the read voltage set for the soft decoding operation contains more read voltages. Take the MLC flash memory for example. The read voltage set for the hard decoding operation contains three read voltages. In contrast, the read voltage set for the soft decoding operation contains nine read voltages. Consequently, the time period of performing the decoding process C is longer than the time period of performing the decoding process B.

For example, additional n retry read voltage sets for the soft decoding operation are stored in the retry table 106. The controlling circuit 101 sequentially performs the soft decoding operation according to the predetermined sequence of the n retry read voltage sets in the retry table 106 until the decoding operation is successfully done. If the decoding operation is successfully done according to one of the n retry read voltage sets, it means that the decoding process C passes. Whereas, if the data cannot be successfully decoded according to the entire of the n retry read voltage sets, it means that the decoding process C fails. Under this circumstance, the controlling circuit 101 generates a failed message to the host 14 to indicate that the decoding process fails.

As mentioned above, if the decoding process A fails, the controlling circuit 101 performs the read retry process. In the read retry process, the controlling circuit 101 has to perform the decoding process B at first. If the controlling circuit 101 confirms that the decoding process B fails, the controlling circuit 101 performs the decoding process C. If the controlling circuit 101 confirms that the decoding process C fails, the controlling circuit 101 issues the failed message to the host 14.

For example, m retry read voltage sets Vr_r1~Vr_rm for the decoding process B are recorded in the retry table 106. During the decoding process B, the controlling circuit 101 sequentially reads the rn retry read voltage sets from the retry table 106 and sequentially provides the rn read voltage sets to the non-volatile memory 105. That is, the controlling circuit 101 is unable to directly acquire the suitable retry read voltage set to perform the read retry process. In other words, the controlling circuit 101 spends a long time providing unsuitable retry read voltage sets to the non-volatile memory 105. Since the time period of performing the read retry process is very long, the throughput and the read speed of the solid state storage device 10 are largely decreased.

SUMMARY OF THE INVENTION

An embodiment of the present invention provides a solid state storage device. The solid state storage device includes a non-volatile memory and a controlling circuit. The non-volatile memory includes a first block. The controlling circuit is connected with the non-volatile memory. The controlling circuit includes a cache table and a retry table. Moreover, plural predetermined retry read voltage sets are recorded in the retry table. In a first read retry process, the controlling circuit judges whether an information corresponding to the first block is recorded in the cache table. If the information corresponding to the first block is not recorded in the cache table, the controlling circuit sequentially provides the plural predetermined retry read voltage sets to the non-volatile memory according to a sequence of the plural predetermined retry read voltage sets in the retry table and performs a read retry operation on the first block. If a read data of the first block is successfully decoded through the read retry operation according to a first predetermined retry read voltage set of the plural predetermined retry read voltage sets in the retry table, the controlling circuit records the first predetermined retry read voltage set into the cache table.

Another embodiment of the present invention provides a read control method for a solid state storage device. The solid state storage device includes a non-volatile memory and a controlling circuit. The non-volatile memory includes plural blocks. The controlling circuit is connected with the non-volatile memory and includes a cache table and a retry table. Moreover, plural predetermined retry read voltage sets are recorded in the retry table. The read control method includes steps of: implementing a first read retry process to perform a read retry operation on a first block of the plural blocks; and judging whether at least one retry read voltage set corresponding to the first block is recorded in the cache table. If the at least one retry read voltage set corresponding to the first block is recorded in the cache table, the read retry operation is performed on the first block according to the at least one retry read voltage set. If the at least one retry read voltage set corresponding to the first block is not recorded in the cache table, the read retry operation is performed on the first block according to the plural predetermined retry read voltage sets in the retry table.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing e following detailed description and accompanying drawings, in which:

FIGS. 5A~5E schematically illustrate a method of updating the contents of the cache table during the read retry process according to an embodiment of the present invention;

FIGS. 7A~7F schematically illustrate a method of updating the contents of the cache table during the read retry process according to another embodiment of the present invention.

DETAILED DESCRIPTION OF PREFERRED EMBODIMENTS

Figure 1:
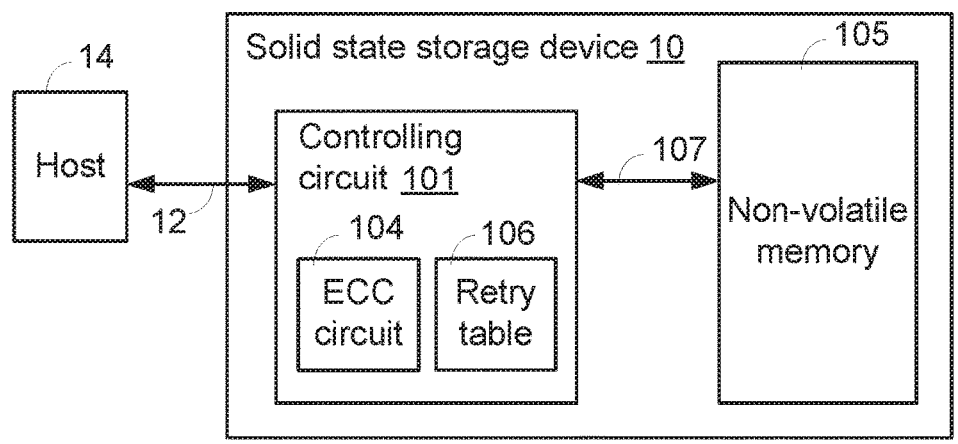
FIG. 1 (prior art) is a schematic functional block diagram illustrating a conventional solid state storage device.
Figure 2A:
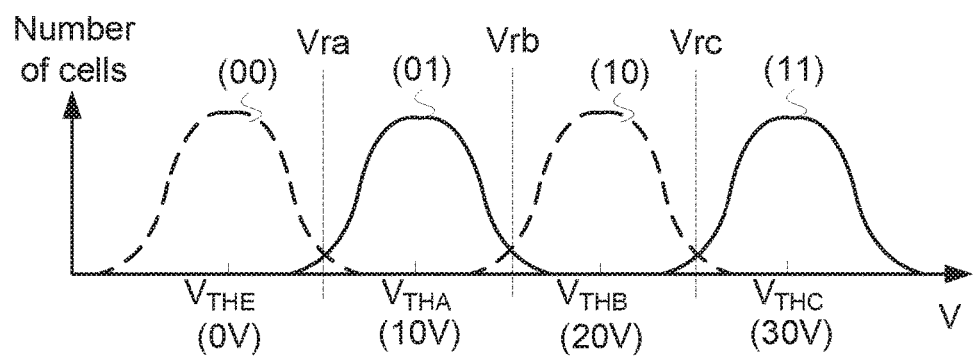
FIG. 2A (prior art) schematically illustrates the threshold voltage distribution curves of the MLC flash memory in different storing states.
Figure 2B:
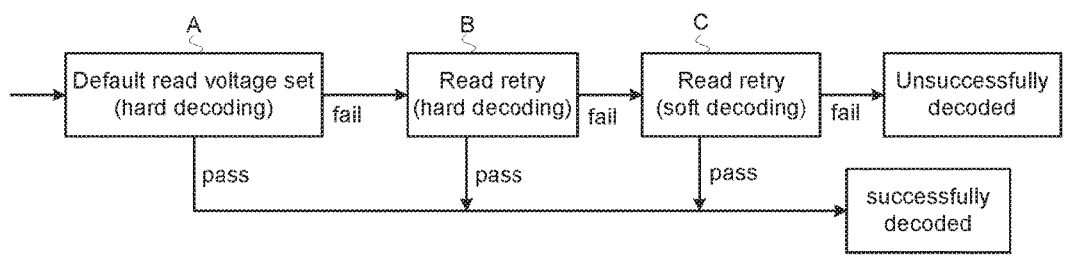
FIG. 2B (prior art) is a flowchart illustrating a read control method for a solid state storage device according to the prior art.
Figure 3:
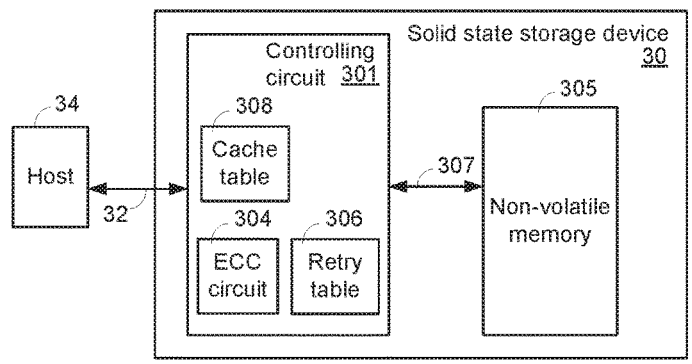
FIG. 3 is a schematic functional block diagram illustrating a solid state storage device according to an embodiment of the present invention.

FIG. 3 is a schematic functional block diagram illustrating a solid state storage device according to an embodiment of the present invention. As shown in FIG. 3, the solid state storage device 30 is connected with a host 34 through an external bus 32. Generally, the external bus 32 is a USB bus, an SATA bus, a PCIe bus, or the like. Moreover, the solid state storage device 30 comprises a controlling circuit 301 and a non-volatile memory 305.

The controlling circuit 301 is connected with the non-volatile memory 305 through an internal bus 307. According to a command from the host 34, the controlling circuit 301 stores the received write data into the non-volatile memory 305, or the controlling circuit 301 acquires a read data from the non-volatile memory 305 and transmits the read data to the host 34.

Generally, the controlling circuit 301 stores a default read voltage set. During a read cycle, the controlling circuit 301 acquires the read data from the non-volatile memory 305 according to the default read voltage set.

The controlling circuit 301 comprises an error correction (ECC) circuit 304. The ECC circuit 304 is used for correcting the error bits of the read data. After the error bits of the read data are corrected, the corrected read data are transmitted to the host 34. However, if the ECC circuit 304 is unable to successfully correct all bits of the read data, the controlling circuit 301 performs a read retry operation on the non-volatile memory 305.

In an embodiment, the controlling circuit 301 further comprises a cache table 308 and a retry table 306. While a read retry process of the solid state storage device 30 is performed, the controlling circuit 301 firstly checks the cache table 308 and then determined whether the read retry process is performed according to the contents of the cache table.

Figure 4:
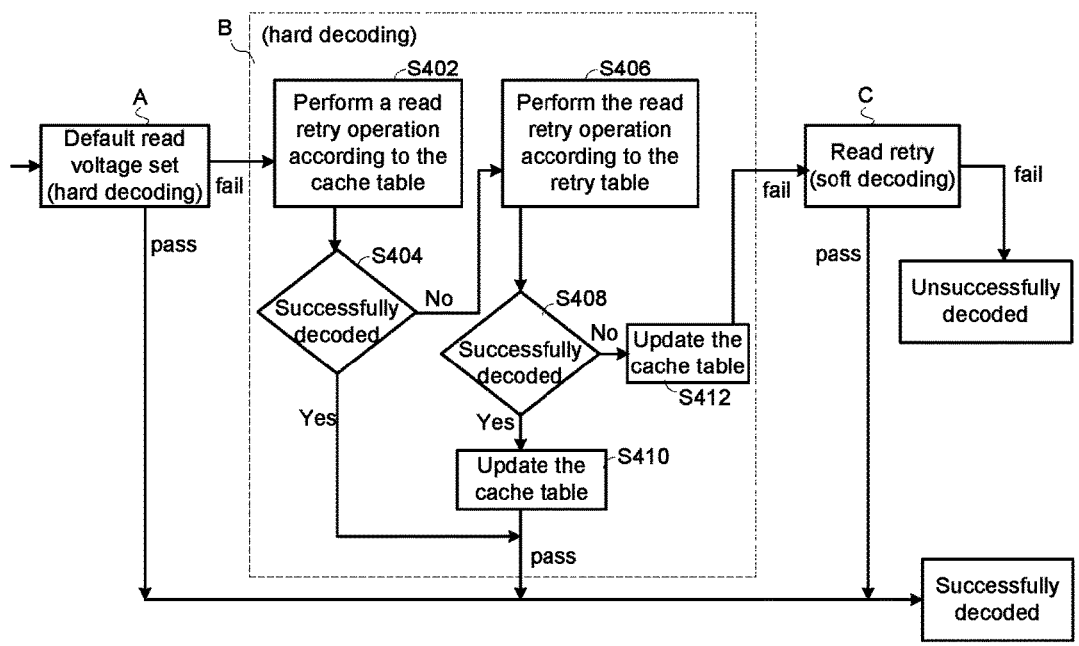
FIG. 4 is a flowchart of a read control method for the solid state storage device according to a first embodiment of the present invention.

FIG. 4 is a flowchart of a read control method for the solid state storage device according to a first embodiment of the present invention. During the read cycle, the controlling circuit 301 firstly performs a decoding process A. In the decoding process A, a hard decoding operation is performed according to a default read voltage set Vr_d.

That is, the controlling circuit 301 provides the default read voltage set Vr_d to the non-volatile memory 305 to acquire the read data of the block, and the ECC circuit 304 performs the hard decoding operation to correct the read data. If the error bits in the read data can be corrected, it means that the decoding operation is successfully done and the decoding process A passes. Consequently, the corrected read data is transmitted from the controlling circuit 301 to the host 34. Whereas, if the error bits in the read data cannot be corrected, the decoding process A fails. Then, the controlling circuit 301 implements a first read retry process.

In the first read retry process, a decoding process B is performed. If the decoding process B fails, the controlling circuit implements a second read retry process. In the second read retry process, a decoding process C is performed. In the decoding process B, the ECC circuit 304 of the controlling circuit 301 performs the hard decoding operation to correct the read data. In the decoding process C, the ECC circuit 304 of the controlling circuit 301 performs a soft decoding operation to correct the read data.

In the decoding process B, the controlling circuit 301 performs a read retry operation according to the cache table 308 (Step S402). If the decoding operation is successfully done according to the cache table 308 (Step S404), it means that the decoding process B passes. If the decoding operation is not successfully done according to the contents of the cache table 308 in the step S404, the controlling circuit 301 performs the read retry operation according to the retry table 306 (Step S406).

For example, m retry read voltage sets Vr_r1~Vr_rm (predetermined retry read voltage sets) are stored in the retry table 306. In the step S406, the controlling circuit 301 sequentially performs the hard decoding operation according to the predetermined sequence of the m retry read voltage sets Vr_r1~Vr_rm in the retry table 306. The ECC circuit 304 of the controlling circuit 301 performs the hard decoding operation to correct the read data.

If the decoding operation is successfully done according to one of the m retry read voltage sets Vr_r1~Vr_rm in a step S408, the controlling circuit 301 updates the cache table 308 (Step S410). Under this circumstance, the decoding process B passes. Whereas, if the data cannot be successfully decoded according to the entire of the m retry read voltage sets Vr_r1~Vr_rm in the step S408, the controlling circuit 301 updates the cache table 308 (Step S412). Under this circumstance, the decoding process B fails. Then, the controlling circuit 301 performs a decoding process C.

In the decoding process C, a soft decoding operation is performed according to the retry read voltage set. For example, additional n retry read voltage sets for the soft decoding operation are stored in the retry table 306. The controlling circuit 301 sequentially performs the soft decoding operation according to the predetermined sequence of the n retry read voltage sets in the retry table 306. If the decoding operation is successfully done according to one of the n retry read voltage sets, it means that the decoding process C passes. Whereas, if the data cannot be successfully decoded according to the entire of the n retry read voltage sets, it means that the decoding process C fails. Under this circumstance, the controlling circuit 301 generates a failed message to the host 34 to indicate that the decoding process fails.

FIGS. 5A-5E schematically illustrate a method of updating the contents of the cache table during the read retry process according to an embodiment of the present invention. For example, the non-volatile memory 305 is divided into 128 blocks B0~B127. In the cache table 308, each block corresponds to s slots (Slot 0~Slot s−1).

In case that the quality of the non-volatile memory 305 is good, the hard decoding operation can be successfully done according to the default read voltage set Vr_d. Since the decoding process A passes, there is no need to enter the decoding process B, and no information is recorded in the cache table 308 as shown in FIG. 5A.

During the subsequent read cycle, if the read data of the block B1 cannot be successfully decoded according to the default read voltage set Vr_d, the controlling circuit 301 performs the decoding process B. In the decoding process B, the controlling circuit 301 performs a read retry operation according to the cache table 308 (Step S402).

Since no information corresponding to the block B1 is recorded in the cache table 308 (see FIG. 5A), the decoding operation cannot be successfully done according to the cache table 308 in the step S404. Then, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B1. It is assumed that the read data is successfully decoded according to the second retry read voltage set Vr_r2. Since the judging condition of the step S408 is satisfied, the controlling circuit 301 updates the cache table 308 (Step S410). As shown in FIG. 5B, the second retry read voltage set Vr_r2 is recorded into the cache table 308 at the location corresponding to the Slot 0 of the block B1. And, the decoding process B passes.

During the subsequent read cycle, if the read data of the block B1 cannot be successfully decoded according to the default read voltage set Vr_d, the controlling circuit 301 performs the decoding process B again. In the decoding process B, the controlling circuit 301 performs the read retry operation according to the cache table 308 (Step S402). Since the second retry read voltage set Vr_r2 has been recorded into the cache table 308 at the location corresponding to the Slot 0 of the block B1 (see FIG. 5B), the controlling circuit 301 provides the second retry read voltage set Vr_r2 to the non-volatile memory 305 and performs the read retry operation on the block B1.

If the read data of the block B1 is successfully decoded according to the second retry read voltage set Vr_r2 in the step S404, the decoding process B passes. Whereas, if the read data of the block B1 cannot be successfully decoded according to the second retry read voltage set Vr_r2 in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B1. It is assumed that the read data is successfully decoded according to the eighth retry read voltage set Vr_r8. Since the judging condition of the step S408 is satisfied, the controlling circuit 301 updates the cache table 308 (Step S410). As shown in FIG. 5C, the eighth retry read voltage set Vr_r8 is further recorded into the cache table 308 at the location corresponding to the Slot 1 of the block B1. And, the decoding process B passes.

During the subsequent read cycle, if the read data of the block B1 cannot be successfully decoded according to the default read voltage set Vr_d, the controlling circuit 301 performs the decoding process B again. In the decoding process B, the controlling circuit 301 performs the read retry operation according to the cache table 308 (Step S402). As shown in FIG. 5C, the second retry read voltage set Vr_r2 has been recorded into the cache table 308 at the location corresponding to the Slot 0 of the block B1, and the eighth retry read voltage set Vr_r8 has been recorded into the cache table 308 at the location corresponding to the Slot 1 of the block B1. Consequently, the controlling circuit 301 provides the second retry read voltage set Vr_r2 and/or the eighth retry read voltage set Vr_r8 to the non-volatile memory 305 and performs the read retry operation on the block B1.

In an embodiment, the controlling circuit 301 selects the last retry read voltage set from the cache table 308 and provides the last retry read voltage set to the non-volatile memory 305. Since the eighth retry read voltage set Vr_r8 is the last retry read voltage set in the cache table 305, the controlling circuit 301 provides the eighth retry read voltage set Vr_r8 to the non-volatile memory 305 and performs the read retry operation on the block B1.

In another embodiment, the controlling circuit 301 sequentially provides the retry read voltage sets in the cache table 308 to the non-volatile memory 305 in a forward order. That is, the controlling circuit 301 sequentially provides the second retry read voltage set Vr_r2 and the eighth retry read voltage set Vr_r8 to the non-volatile memory 305 and performs the read retry operation on the block B1. In a further embodiment, the controlling circuit 301 sequentially provides the retry read voltage sets in the cache table 308 to the non-volatile memory 305 in a backward order. That is, the controlling circuit 301 sequentially provides the eighth retry read voltage set Vr_r8 and the second retry read voltage set Vr_r2 to the non-volatile memory 305 and performs the read retry operation on the block B1.

If the read data of the block B1 is successfully decoded according to the second retry read voltage set Vr_r2 or the eighth retry read voltage set Vr_r8 in the step S404, the decoding process B passes. Whereas, if the read data of the block B1 cannot be successfully decoded according to the second retry read voltage set Vr_r2 or the eighth retry read voltage set Vr_r8 in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B1. It is assumed that the read data is successfully decoded according to the m-th retry read voltage set Vr_rm. Since the judging condition of the step S408 is satisfied, the controlling circuit 301 updates the cache table 308 (Step S410). As shown in FIG. 5D, the m-th retry read voltage set Vr_rm is further recorded into the cache table 308 at the location corresponding to the Slot 2 of the block B1. And, the decoding process B passes.

During the subsequent read cycle, if the read data of the block B1 cannot be successfully decoded according to the default read voltage set Vr_d, the controlling circuit 301 performs the decoding process B again. In the decoding process B, the controlling circuit 301 performs the read retry operation according to the cache table 308 (Step S402). As shown in FIG. 5O, the second retry read voltage set Vr_r2 has been recorded into the cache table 308 at the location corresponding to the Slot 0 of the block B1, the eighth retry read voltage set Vr_r8 has been recorded into the cache table 308 at the location corresponding to the Slot 1 of the block B1, and the m-th retry read voltage set Vr_rm has been recorded into the cache table 308 at the location corresponding to the Slot 2 of the block B1. Consequently, the controlling circuit 301 provides the second retry read voltage set Vr_r2, the eighth retry read voltage set Vr_r8 and/or the m-th retry read voltage set Vr_rm to the non-volatile memory 305 and performs the read retry operation on the block B1.

In an embodiment, the controlling circuit 301 selects the last retry read voltage set from the cache table 308 and provides the last retry read voltage set to the non-volatile memory 305. In another embodiment, the controlling circuit 301 sequentially provides the retry read voltage sets in the cache table 308 to the non-volatile memory 305 in a forward order. In a further embodiment, the controlling circuit 301 sequentially provides the retry read voltage sets in the cache table 308 to the non-volatile memory 305 in a backward order.

If the read data of the block B1 is successfully decoded according to the second retry read voltage set Vr_r2, the eighth retry read voltage set Vr_r8 or the m-th retry read voltage set Vr_rm in the step S404, the decoding process B passes. Whereas, if the read data of the block B1 cannot be successfully decoded according to the second retry read voltage set Vr_r2, the eighth retry read voltage set Vr_r8 or the m-th retry read voltage set Vr_rm in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B1. It is assumed that the read data cannot be successfully decoded according to all of the m retry read voltage sets Vr_r1~Vr_rm. Since the judging condition of the step S408 is not satisfied, the controlling circuit 301 updates the cache table 308 (Step S412). As shown in FIG. 5E, the data in Slot 0~Slot s−1 of the block B1 are deleted and a specified code (e.g., FF) is stored in the Slot 0 of the block B1. Consequently, the cache table 308 is updated. The controlling circuit 301 confirms that the decoding process B fails. Then, the controlling circuit 301 performs a decoding process C.

It is noted that numerous modifications and alterations may be made while retaining the teachings of the invention. For example, in another embodiment, it is not necessary to delete the data in Slot 0~Slot s−1 of the block B1. Under this circumstance, the specified code (e.g., FF) is stored in a blank slot of the block B1.

During the subsequent read cycle, if the read data of the block B1 cannot be successfully decoded according to the default read voltage set Vr_d, the controlling circuit 301 performs the decoding process B again. Since the specified code (e.g., FF) has been recorded in the Slot 0 of the block B1, the controlling circuit 301 confirms that the decoding process B fails according to the specified code. Then, the controlling circuit 301 performs the decoding process C.

From the above descriptions, if the read data cannot be successfully decoded according to all of the m retry read voltage sets Vr_r1~Vr_rm of the retry table 306, the controlling circuit 301 records the specified code (e.g., FF) into a slot of the corresponding block in the cache table 308.

Figure 6:
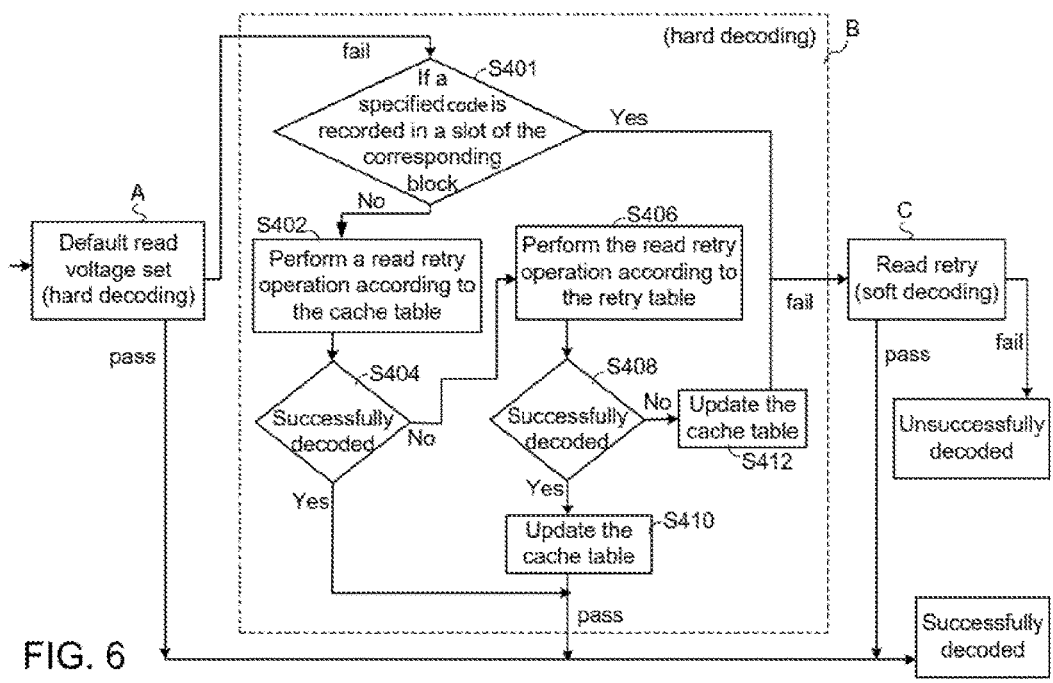
FIG. 6 is a flowchart of a read control method for the solid state storage device according to a second embodiment of the present invention.

FIG. 6 is a flowchart of a read control method for the solid state storage device according to a second embodiment of the present invention. In comparison with the first embodiment, the decoding process B of this embodiment further comprises a judging step S401. The step S401 will be described as follows. Since the other steps of this embodiment are similar to those of the first embodiment, and are not redundantly described herein.

After the decoding process B is started, the controlling circuit 301 judges whether a specified code is recorded in a slot of the corresponding block (Step S401). If the judging condition of the step S401 is satisfied, it means that the decoding process B fails. Then, the controlling circuit 301 performs a decoding process C. If the judging condition of the step S401 is not satisfied, the controlling circuit 301 performs the step S402.

The cache table 308 as shown in FIGS. 5A~5E is associated with the non-volatile memory 305 with 128 blocks B0~B127. In case that the non-volatile memory 305 contains more blocks, the cache table 308 is expanded to record the retry read voltage sets that have been successfully decode the read data.

For effectively reducing the size of the cache table 308, the cache table 308 may be modified. FIGS. 7A~7F schematically illustrate a method of updating the contents of the cache table during the read retry process according to another embodiment of the present invention. The cache table 308 comprises an index table 308a and a data table 308b. For example, the non-volatile memory 305 is divided into 1024 blocks B0~B1023, and the index table 308*a* contains 128 entries (Entry 0~Entry 127). The 1024 blocks B0~B1023 may be grouped and corresponded to one of 128 entries (Entry 0~Entry 127). In the index table 308*a*, each entry is assigned to one of corresponding eight blocks.

In case that the controlling circuit 301 intends to perform the read retry process on a specified block of the non-volatile memory 305, the controlling circuit 301 divides the block number of the specified block by the total number of the entries to obtain a remainder. The remainder denotes the corresponding entry. For example, if the controlling circuit 301 intends to perform the read retry process on the block B129, the information of the block B129 is recorded in the first entry (Entry 1) because the block number (129) divided by the total number of entries of the index table 308*a* (128) is 1. Similarly, the information of the block B1, the block B257, the block B385, the block B513, the block B641, the block B769 or the block B897 is possibly recorded in the first entry (Entry 1).

In case that the quality of the non-volatile memory 305 is good, the hard decoding operation can be successfully done according to the default read voltage set Vr_d. Since the decoding process A passes, there is no need to enter the decoding process B, and no information is recorded in the cache table 308 as shown in FIG. 7A.

During the subsequent read cycle, if the read data of the block B129 cannot be successfully decoded according to the default read voltage set Vr_d, the controlling circuit 301 performs the decoding process B. In the decoding process B, the controlling circuit 301 performs a read retry operation according to the cache table 308 (Step S402).

Since no information corresponding to the block B1 is recorded in the cache table 308 (see FIG. 7A), the decoding operation cannot be successfully done according to the cache table 308 in the step S404. Then, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B129.

It is assumed that the read data is successfully decoded according to the sixth retry read voltage set Vr_r6. Since the judging condition of the step S408 is satisfied, the controlling circuit 301 updates the cache table 308 (Step S410). As shown in FIG. 7B, the information of the block B129 is recorded in the first entry (Entry 1) of the index table 308*a*, and the sixth retry read voltage set Vr_r6 is recorded into the data table 308*b* at the location corresponding to the Slot 0 of the first entry (Entry 1). And, the decoding process B passes.

During the subsequent read cycle, if the read data of the block B129 cannot be successfully decoded according to the default read voltage set Vr_d, the controlling circuit 301 performs the decoding process B again. In the decoding process B, the controlling circuit 301 performs the read retry operation according to the cache table 308 (Step S402). As shown in FIG. 7B, the information of the block B129 has been recorded in the first entry (Entry 1) of the index table 308*a*. It means that the data in the first entry (Entry 1) belongs to the block B129. Moreover, the sixth retry read voltage set Vr_r6 has been recorded into the data table 308*b* at the location corresponding to the Slot 0 of the first entry (Entry 1). Consequently, the controlling circuit 301 provides the sixth retry read voltage set Vr_r6 to the non-volatile memory 305 and performs the read retry operation on the block B129.

If the read data of the block B129 is successfully decoded according to the sixth retry read voltage set Vr_r6 in the step S404, the decoding process B passes. Whereas, if the read data of the block B129 cannot be successfully decoded according to the sixth retry read voltage set Vr_r6 in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B129. It is assumed that the read data is successfully decoded according to the twelfth retry read voltage set Vr_r12. Since the judging condition of the step S408 is satisfied, the controlling circuit 301 updates the cache table 308 (Step S410). As shown in FIG. 7C, the twelfth retry read voltage set Vr_r12 is further recorded into the data table 308*b* at the location corresponding to the Slot 1 of the first entry (Entry 1). And, the decoding process B passes.

During the subsequent read cycle, if the read data of the block B129 cannot be successfully decoded according to the default read voltage set Vr_d, the controlling circuit 301 performs the decoding process B again. In the decoding process B, the controlling circuit 301 performs the read retry operation according to the cache table 308 (Step S402). As shown in FIG. 7C, the information of the block B129 has been recorded in the first entry (Entry 1) of the index table 308*a*. It means that the data in the first entry (Entry 1) belongs to the block B129. Moreover, the sixth retry read voltage set Vr_r6 has been recorded into the data table 308*b* at the location corresponding to the Slot 0 of the first entry (Entry 1), and the twelfth retry read voltage set Vr_r12 has been recorded into the data table 308*b* at the location corresponding to the Slot 1 of the first entry (Entry 1). Consequently, the controlling circuit 301 provides the sixth retry read voltage set Vr_r6 and/or the twelfth retry read voltage set Vr_r12 to the non-volatile memory 305 and performs the read retry operation on the block B129.

In an embodiment, the controlling circuit 301 selects the last retry read voltage set from the cache table 308 and provides the last retry read voltage set to the non-volatile memory 305. In another embodiment, the controlling circuit 301 sequentially provides the retry read voltage sets in the cache table 308 to the non-volatile memory 305 in a forward order. In a further embodiment, the controlling circuit 301 sequentially provides the retry read voltage sets in the cache table 308 to the non-volatile memory 305 in a backward order.

If the read data of the block B129 is successfully decoded according to the sixth retry read voltage set Vr_r6 or the twelfth retry read voltage set Vr_r12 in the step S404, the decoding process B passes. Whereas, if the read data of the block B129 cannot be successfully decoded according to the sixth retry read voltage set Vr_r6 or the twelfth retry read voltage set Vr_r12 in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B129. It is assumed that the read data is successfully decoded according to the m-th retry read voltage set Vr_rm. Since the judging condition of the step S408 is satisfied, the controlling circuit 301 updates the cache table 308 (Step S410). As shown in FIG. 7O, the m-th retry read voltage set Vr_rm is further recorded into the data table 308b at the location corresponding to the Slot 2 of the first entry (Entry 1). And, the decoding process B passes.

During the subsequent read cycle, if the read data of the block B129 cannot be successfully decoded according to the default read voltage set Vr_d, the controlling circuit 301 performs the decoding process B again. In the decoding process B, the controlling circuit 301 performs the read retry operation according to the cache table 308 (Step S402). As shown in FIG. 7D, the information of the block B129 has been recorded in the first entry (Entry 1) of the index table 308a. It means that the data in the first entry (Entry 1) belongs to the block B129. Moreover, the sixth retry read voltage set Vr_r6 has been recorded into the data table 308b at the location corresponding to the Slot 0 of the first entry (Entry 1), the twelfth retry read voltage set Vr_r12 has been recorded into the data table 308b at the location corresponding to the Slot 1 of the first entry (Entry 1), and the m-th retry read voltage set Vr_rm has been recorded into the data table 308b at the location corresponding to the Slot 2 of the first entry (Entry 1). Consequently, the controlling circuit 301 provides the sixth retry read voltage set Vr_r6, the twelfth retry read voltage set Vr_r12 and/or the m-th retry read voltage set Vr_rm to the non-volatile memory 305 and performs the read retry operation on the block B129.

If the read data of the block B129 is successfully decoded according to the sixth retry read voltage set Vr_r6, the twelfth retry read voltage set Vr_r12 or the m-th retry read voltage set Vr_rm in the step S404, the decoding process B passes. Whereas, if the read data of the block B129 cannot be successfully decoded according to the sixth retry read voltage set Vr_r6, the twelfth retry read voltage set Vr_r12 or the m-th retry read voltage set Vr_rm in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B129. It is assumed that the read data cannot be successfully decoded according to all of the m retry read voltage sets Vr_r1~Vr_rm. Since the judging condition of the step S408 is not satisfied, the controlling circuit 301 updates the cache table 308 (Step S412). As shown in FIG. 7E, the data in Slot 0~Slot s−1 of the first entry (Entry 1) of the data table 308b are deleted and a specified code (e.g., FF) is stored in the Slot 0 of the first entry (Entry 1) of the data table 308b. Consequently, the cache table 308 is updated. The controlling circuit 301 confirms that the decoding process B fails. Then, the controlling circuit 301 performs a decoding process C.

It is noted that numerous modifications and alterations may be made while retaining the teachings of the invention. For example, in another embodiment, it is not necessary to delete the data in Slot 0~Slot s−1 corresponding to the block B129. Under this circumstance, the specified code (e.g., FF) is stored in a blank slot corresponding to the block B129.

During the subsequent read cycle, if the read data of the block B129 cannot be successfully decoded according to the default read voltage set Vr_d, the controlling circuit 301 performs the decoding process B again. Since the specified code (e.g., FF) has been recorded in the Slot 0 of the first entry (Entry 1) of the data table 308b, the controlling circuit 301 confirms that the decoding process B fails according to the specified code. Then, the controlling circuit 301 performs the decoding process C.

During the subsequent read cycle, if the read data of the block B385 cannot be successfully decoded according to the default read voltage set Vr_d, the controlling circuit 301 performs the decoding process B again. In the decoding process B, the controlling circuit 301 performs the read retry operation according to the cache table 308 (Step S402). The block number (385) of the block B385 divided by the total number of entries of the index table 308a (128) is 1. However, as shown in FIG. 7E, the information of the block B129 has been recorded in the first entry (Entry 1) of the index table 308a. It means that the data in the first entry (Entry 1) belongs to the block B129 rather than the block B385. Since the read data of the block B385 cannot be successfully decoded in the step S404, the controlling circuit 301 performs the read retry operation according to the retry table 306 (Step S406).

In the step S406, the controlling circuit 301 sequentially provides the retry read voltage sets Vr_r1~Vr_rm to the non-volatile memory 305 according to the predetermined sequence of the retry read voltage sets Vr_r1~Vr_rm in the retry table 306. In addition, the controlling circuit 301 sequentially performs the hard decoding operation on the block B385.

It is assumed that the read data is successfully decoded according to the third retry read voltage set Vr_r3. Since the judging condition of the step S408 is satisfied, the controlling circuit 301 updates the cache table 308 (Step S410). The block number (385) of the block B385 divided by the total number of entries of the index table 308a (128) is 1. Since the information of the block B129 has been recorded in the first entry (Entry 1) of the index table 308a, the data in Slot 0~Slot s−1 of the first entry (Entry 1) of the data table 308b are deleted. Then, as shown in FIG. 7F, the information of the block B385 is recorded in the first entry (Entry 1) of the index table 308a, and the third retry read voltage set Vr_r3 is recorded into the data table 308b at the location corresponding to the Slot 0 of the first entry (Entry 1). And, the decoding process B passes.

In the above embodiments, the present invention provides a solid state storage device and a read control method for the solid state storage device. If the read data of a specified block of the non-volatile memory 305 cannot be successfully decoded according to the default read voltage set Vr_d, the controlling circuit 301 performs the read retry process.

In case that a specified retry read voltage set once successfully decoding the read data of the specified block has been stored in the cache table 308, the controlling circuit 301 provides the specified retry read voltage set to the non-volatile memory 305 and performs the read retry operation on the specified block. If the read data of the specified block is successfully decoded according to the specified retry read voltage set of the cache table 308, the decoding process passes, and the corrected read data in the specified block is transmitted to the host 34. Whereas, if the read data of the specified block is not successfully decoded according to the specified retry read voltage set of the cache table 308, the controlling circuit 301 sequentially provides m retry read voltage sets to the non-volatile memory 305 according to the predetermined sequence of the m retry read voltage sets in the retry table 306.

If the read data of the specified block is successfully decoded according to one of the m retry read voltage sets in the retry table 306, this retry read voltage set is recorded in the cache table 308. Whereas, if the read data of the specified block is not successfully decoded according to all of the m retry read voltage sets in the retry table 306, the controlling circuit 301 stored a specified code (e.g., FF) into the cache table 308.

In accordance with the feature of the present invention, the retry read voltage set once successfully decoding the read data of the specified block has been stored in the cache table 308. In the read retry process, the controlling circuit 301 firstly performs the read retry operation on the specified block according to the retry read voltage set in the cache table 308. As previously described, the conventional read control method performs the read retry process according to the retry table. When compared with the conventional technology, the read control method of the present invention is time-saving. Besides, if the specified code (e.g., FF) has been stored in the cache table 308 corresponding to the specified block, the controlling circuit 301 directly performs next decoding process that using other decoding method.

In the above embodiments, the concepts of using the cache table are applied to the decoding process B. It is noted that the concepts of using the cache table can be also applied to the decoding process C. That is, the read voltage set once successfully decoding the read data of the specified block is previously stored in the cache table while the soft decoding operation is performed. Consequently, the time period of performing the read retry process by the solid state storage device is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A read control method for a solid state storage device, the solid state storage device comprising a non-volatile memory and a controlling circuit, the non-volatile memory comprising plural blocks, the controlling circuit being connected with the non-volatile memory and comprising a cache table and a retry table, plural predetermined retry read voltage sets being recorded in the retry table, the read control method comprising steps of:
   implementing a first read retry process to perform a read retry operation on a first block of the plural blocks; and
   judging whether at least one retry read voltage set corresponding to the first block is recorded in the cache table,
   wherein if the at least one retry read voltage set corresponding to the first block is recorded in the cache table, the read retry operation is performed on the first block according to the at least one retry read voltage set, and
   wherein if the at least one retry read voltage set corresponding to the first block is not recorded in the cache table, the read retry operation is performed on the first block according to the plural predetermined retry read voltage sets in the retry table,
   wherein if a read data of the first block is not successfully decoded through the read retry operation according to the at least one retry read voltage set in the cache table, the controlling circuit performs the read retry operation on the first block according to the plural predetermined retry read voltage sets in the retry table.

2. The read control method as claimed in claim 1, wherein if the at least one retry read voltage set corresponding to the first block is recorded in the cache table, a read data of the first block has been successfully decoded through the read retry operation according to the at least one retry read voltage set.

3. The read control method as claimed in claim 1, wherein if a read data of the first block is successfully decoded through the read retry operation according to a first predetermined retry read voltage set of the plural predetermined retry read voltage sets in the retry table, the controlling circuit records the first predetermined retry read voltage set into the cache table at a location corresponding to the first block.

4. The read control method as claimed in claim 1, further comprising a step of judging whether a specified code corresponding to the first block is recorded in the cache table before the read retry operation is performed on the first block according to the cache table, wherein if the specified code corresponding to the first block is recorded in the cache table, the first read retry process is stopped, and the controlling circuit implements a second read retry process, wherein the first read retry process and the second read retry process use different decoding methods.

5. A solid state storage device, comprising:
   a non-volatile memory comprising a first block; and
   a controlling circuit connected with the non-volatile memory, wherein the controlling circuit comprises a cache table and a retry table, and plural predetermined retry read voltage sets are recorded in the retry table,
   wherein in a first read retry process, the controlling circuit judges whether an information corresponding to the first block is recorded in the cache table, wherein if the information corresponding to the first block is not recorded in the cache table, the controlling circuit sequentially provides the plural predetermined retry read voltage sets to the non-volatile memory according to a sequence of the plural predetermined retry read voltage sets in the retry table and performs a read retry operation on the first block,
   wherein if a read data of the first block is successfully decoded through the read retry operation according to a first predetermined retry read voltage set of the plural predetermined retry read voltage sets in the retry table, the controlling circuit records the first predetermined retry read voltage set into the cache table.

6. The solid state storage device as claimed in claim 5, wherein before the first read retry process, the controlling circuit provides a default read voltage set to the non-volatile memory to read the first block, wherein if the read data of the first block is not successfully decoded according to the default read voltage set, the controlling circuit performs the first read retry process.

7. The solid state storage device as claimed in claim 5, wherein if the information corresponding to the first block is recorded in the cache table, the controlling circuit further judges whether the information contains a specified code, wherein if the information does not contain the specified code, the controlling circuit provides at least one retry read voltage set of the information to the non-volatile memory and performs the read retry operation on the first block according to the at least one retry read voltage set.

8. The solid state storage device as claimed in claim 7, wherein if the read data of the first block is not successfully decoded through the read retry operation according to the at least one retry read voltage set in the cache table, the controlling circuit sequentially provides the plural predetermined retry read voltage sets to the non-volatile memory according to the sequence of the plural predetermined retry read voltage sets in the retry table and performs the read retry operation on the first block.

9. The solid state storage device as claimed in claim 5, wherein if the read data of the first block is not successfully decoded through the read retry operation according to all of the plural predetermined retry read voltage sets in the retry table, the controlling circuit records a specified code into the cache table.

10. A read control method for a solid state storage device, the solid state storage device comprising a non-volatile memory and a controlling circuit, the non-volatile memory comprising plural blocks, the controlling circuit being connected with the non-volatile memory and comprising a cache table and a retry table, plural predetermined retry read voltage sets being recorded in the retry table, the read control method comprising steps of:

implementing a first read retry process to perform a read retry operation on a first block of the plural blocks; and judging whether an information corresponding to the first block is recorded in the cache table, wherein if the information corresponding to the first block is not recorded in the cache table, the read retry operation is performed on the first block according to a sequence of the plural predetermined retry read voltage sets in the retry table, and wherein if the at least one retry read voltage set corresponding to the first block is not recorded in the cache table, the read retry operation is performed on the first block according to the sequence of the plural predetermined retry read voltage sets in the retry table, wherein if a read data of the first block is successfully decoded through the read retry operation according to a first predetermined retry read voltage set of the plural predetermined retry read voltage sets in the retry table, the controlling circuit records the first predetermined retry read voltage set into the cache table.

11. The read control method as claimed in claim 10, wherein if the information corresponding to the first block is recorded in the cache table, the read retry operation is performed on the first block according to at least one retry read voltage set of the information in the cache table.

12. The read control method as claimed in claim 11, wherein if the read data of the first block is not successfully decoded through the read retry operation according to the at least one retry read voltage set in the cache table, the controlling circuit performs the read retry operation on the first block according to the plural predetermined retry read voltage sets in the retry table.

13. The read control method as claimed in claim 10, wherein if the read data of the first block is not successfully decoded through the read retry operation according to all of the plural predetermined retry read voltage sets in the retry table, the controlling circuit records a specified code into the cache table.

* * * * *